United States Patent
Kosonocky et al.

(10) Patent No.: US 9,552,892 B1
(45) Date of Patent: Jan. 24, 2017

(54) SAMPLING CIRCUIT WITH REDUCED METASTABILITY EXPOSURE

(71) Applicant: Advanced Micro Devices, Inc., Sunnyvale, CA (US)

(72) Inventors: Stephen V. Kosonocky, Ft. Collins, CO (US); Krishnan T. Sukumar, Bangalore (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/927,964

(22) Filed: Oct. 30, 2015

(51) Int. Cl.
| | |
|---|---|
| *H03M 1/00* | (2006.01) |
| *G11C 27/02* | (2006.01) |
| *H03K 17/687* | (2006.01) |
| *H03K 3/3562* | (2006.01) |
| *H03K 3/356* | (2006.01) |

(52) U.S. Cl.
CPC ............. *G11C 27/02* (2013.01); *H03K 3/356* (2013.01); *H03K 3/35625* (2013.01); *H03K 17/687* (2013.01)

(58) Field of Classification Search
CPC ...................................................... G11C 27/02
See application file for complete search history.

(56) References Cited

U.S. PATENT DOCUMENTS

| | | | | |
|---|---|---|---|---|
| 8,593,171 | B2 * | 11/2013 | Kosonocky | G01R 31/40 324/764.01 |
| 2004/0163022 | A1 * | 8/2004 | Whetsel | G01R 31/31715 714/726 |

* cited by examiner

*Primary Examiner* — Daniel Puentes
(74) *Attorney, Agent, or Firm* — Zagorin Cave LLP

(57) ABSTRACT

A sampling circuit uses an input stage to sample an input signal and a secondary evaluation stage to maintain the output state of the input stage. Once the input stage transitions at a clock transition, the secondary evaluation stage uses regenerative feedback devices to hold the state to help ensure the sampling circuit only switches once during an evaluation.

14 Claims, 4 Drawing Sheets

SAMPLING CIRCUIT WITH REDUCED METASTABILITY EXPOSURE

BACKGROUND

Field of the Invention

This disclosure relates to sampling circuits and more particularly to reducing metastability exposure associated with sampling circuits.

Description of the Related Art

Sampling circuits can be used to sample values of asynchronous signals. It is desirable that at the clock edge of the clock supplied to the sampling circuit, a sampling circuit evaluates sampled data based on the state of the data setup prior to the clock edge. The circuit of FIG. 1 shows a sampling circuit that samples on the rising edge of the clock signal C. The circuit of FIG. 1 has a long clock to Q (clk-Q) resolution time if the data transitions at an inopportune time relative to the clock. That can cause a metastability exposure. Metastability refers to a circuit, such as a flip-flop, whose output is unstable and oscillates between 0 and 1, eventually settling to either the 0 state or the 1 state. In the circuit shown in FIG. 1, during the evaluation phase, having the data change after the sampling (rising) edge of the clock and before the falling edge of the clock can lead to a false reading. Thus, using the sampling circuit of FIG. 1 in asynchronous sampling applications such as a time-to-digital converter (TDC) can result in false readings. Increasing the size of the feedback devices 101 and 103 used in the sampling circuit to mitigate the likelihood of false readings can slow the internal nodes and reduce speed. In sampling circuits metastability exposure is undesirable and improvements in sampling circuits for asynchronous applications is desirable.

SUMMARY OF EMBODIMENTS OF THE INVENTION

In an embodiment, a sampling circuit includes a first circuit to sample and hold input data responsive to a transition of a clock signal. The first circuit generates an output responsive to the data, wherein the output of the first circuit includes a set and a reset signal. A secondary evaluation circuit includes regenerative feedback devices to further hold a state of the first circuit after the clock transition.

In another embodiment, an apparatus includes a ring oscillator. A plurality of sampling circuits sample respective stages of the ring oscillator. Each of the sampling circuits include a first circuit to sample data responsive to a transition of a clock signal and to generate a set signal and a reset signal and to hold a state corresponding to the set signal and the reset signal. A secondary evaluation circuit includes regenerative feedback devices to hold the state of the first circuit after the clock transition.

In another embodiment a method includes sampling input data responsive to a transition of a clock signal in a first circuit and generating a set signal and a reset signal responsive to a value of the input data. Regenerative feedback devices hold a state of the first circuit corresponding to the set and reset signals after the clock transition.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DETAILED DESCRIPTION

An improved sampling circuit design is provided by using a secondary evaluation circuit for the output state of the sampling circuit. Once the input stage transitions, the secondary evaluation stage uses regenerative feedback devices to hold the state. The feedback devices are sized so that the input stage pull-down devices cannot upset the output state once it transitions at the clock edge. The improved sampling circuit only switches once during an evaluation at the clock transition. These improvements reduce the clk-Q resolution time of the sampling circuit, thereby reducing the metastability exposure of the circuit.

Figure 2:
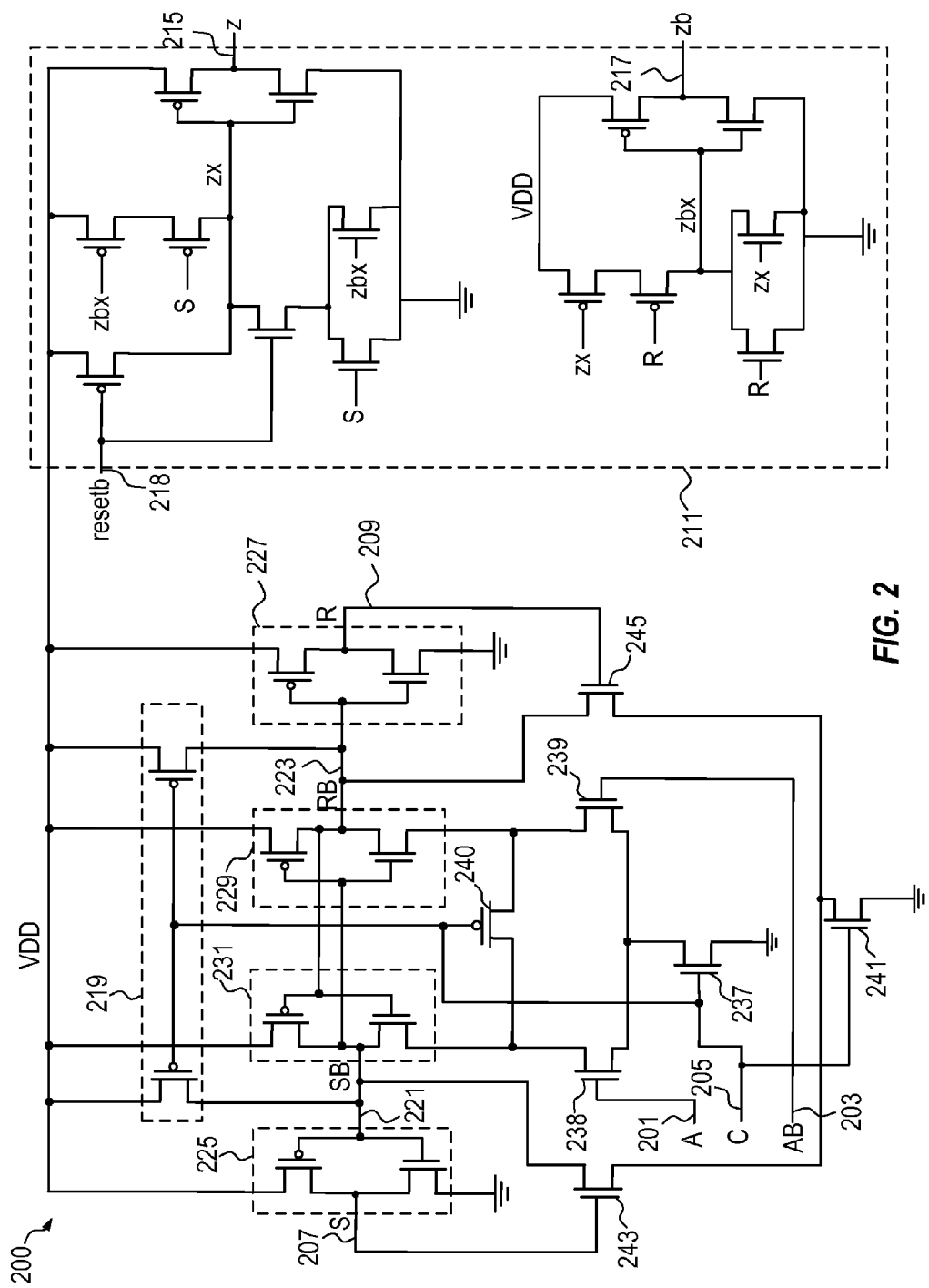
FIG. 2 shows a sampling circuit according to an embodiment with reduced metastability exposure as compared to the circuit of FIG. 1.

Referring to FIG. 2, an embodiment of a sampling circuit 200 with reduced metastability exposure has differential input signals A 201 and AB 203, where A is the positive signal and AB, referred to as "A-bar", is the complementary signal. The sampling circuit 200 also receives the clock signal 205. The circuit shown in FIG. 2 samples on the rising edge of the clock signal 205. Other embodiments may sample on falling edges. The sampling circuit 200 generates a set signal S at node 207 and a reset signal R at node 209 and supplies the S and R signals to a set-reset (SR) latch 211, which is also known as an RS latch. The SR latch 211 sets or resets the positive and negative outputs z 215 and zb 217 of the sampling circuit 200 according to the value of the set and reset signals. Note that the resetb signal 218 is normally high but is low during reset.

Before the rising edge of the clock signal 205, precharge p-channel field effect transistor (PFET) devices 219 charge the SB node 221 (inverted value of the set signal) and the RB node 223 (inverted value of the reset signal). That also causes the set node 207 and the reset node 209 to be pulled low through inverters 225 and 227, respectively. Inverters 229 and 231 are cross coupled and hold the value of the sampled inputs after the sampling edge of the clock signal.

When the clock signal 205 transitions (rising edge in the embodiment of FIG. 2) a path to ground is provided through n-channel field effect transistor (NFET) 237. Depending on the value of inputs A and AB, either node SB 221 will be pulled to ground (if A is high) through NFET 238 (receiving the A input) and NFET 237 or node RB 223 will be pulled to ground (if AB is high) through NFET 239 (receiving the AB input) and NFET 237. The drains of the transistor 238 and 239 receiving 'A' and 'AB' inputs are connected by a PFET 240 driven by the clock signal.

Thus, the value of set and reset are determined based on the value of the A and AB inputs at the rising edge of the clock signal. The sampled values are supplied to SR circuit 211. To prevent changes in the inputs A and AB that occur after the rising edge of the clock from affecting the sampled set and reset values, a secondary evaluation circuit (also referred to as a second stage) holds the output state of the sampling circuit using regenerative feedback devices to hold the state. The secondary evaluation stage includes NFETs 241, 243, and 245. When the clock signal is low, transistor 241 is off. When the clock signal goes high transistor 241 provides a path to ground. Transistors 243 and 245 will pull down either the SB node or the RB node depending on the value of S and R. Thus, for example, if the set signal S is high, the SB node will have a pull down path available through transistors 243 and 241 after the sampling edge of the clock signal. The pull down path regenerates the value of the SB node and the value of the set signal making late arriving transitions on the inputs A and AB (after the sampling edge of the clock signal) unlikely to affect the S and R values. If the reset signal is high, the RB node will have a pull down path available after the sampling edge through transistors 245 and 241. In that case, the pull down path regenerates the value of the RB node and the value of the reset signal making late arriving transitions on the inputs A and AB unlikely to affect the S and R values.

The devices of the secondary evaluation circuit are sized so that the input stage pull-down devices (NFETS 238 and 239) cannot upset the output state once the clock transitions high. The design details of the various PFET and NFET devices shown in the embodiment of FIG. 2, such as size, number of fins, and threshold voltages are technology dependent and will vary in various embodiments.

Figure 1:
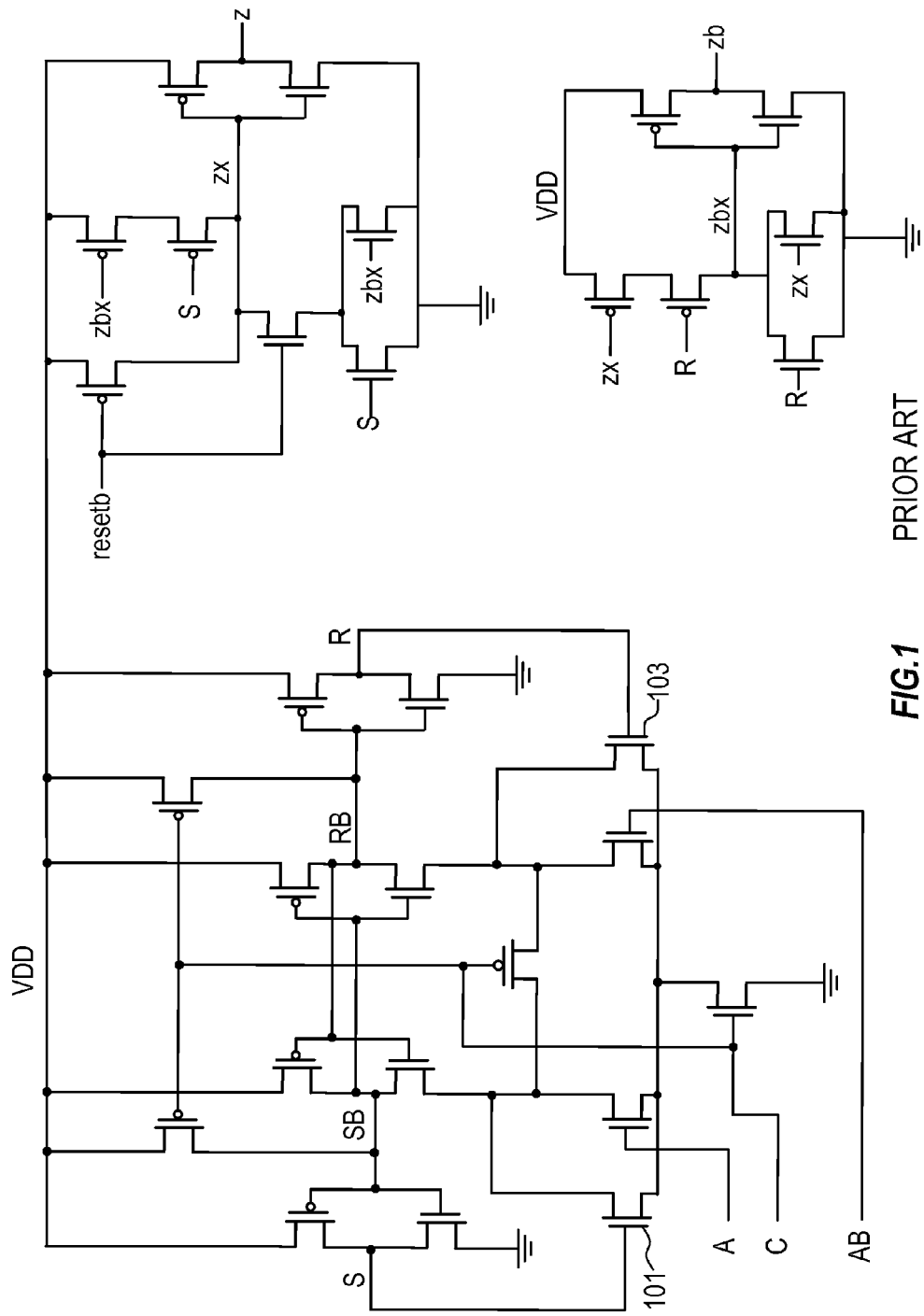
FIG. 1 shows a sampling circuit with metastability exposure.
Figure 3:
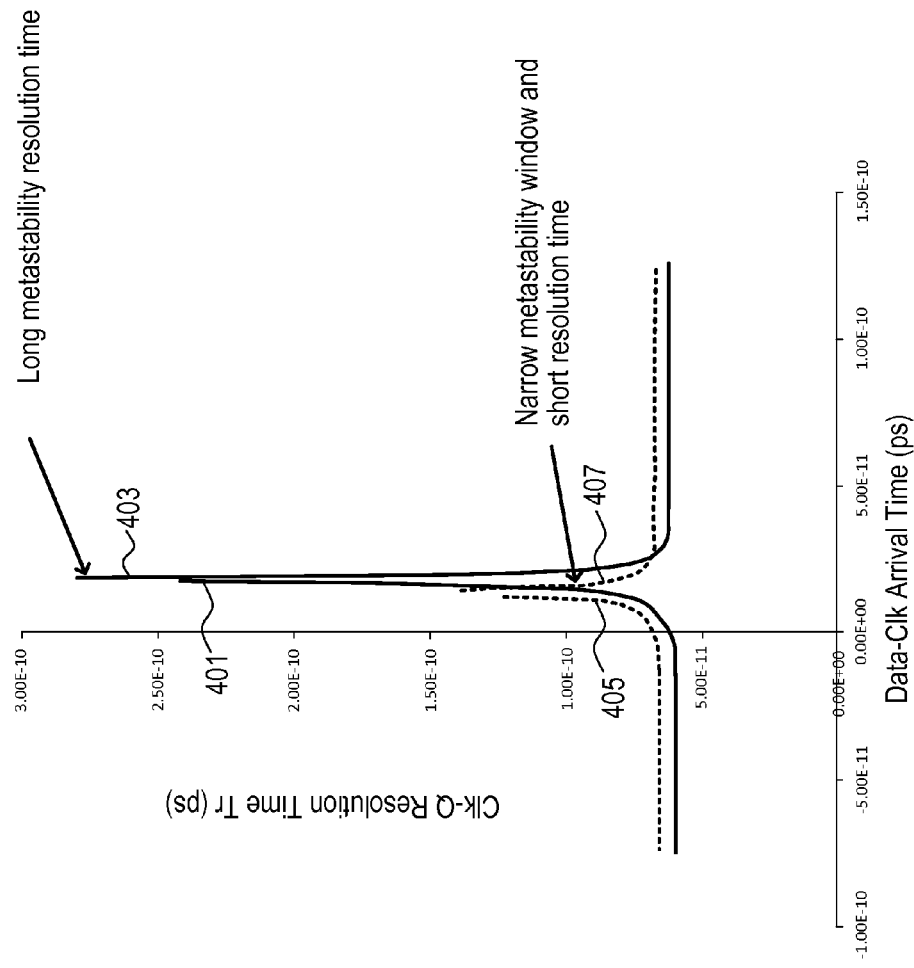
FIG. 3 shows a simulation of operation of the circuit of FIG. 2 as compared to the circuit of FIG. 1.

FIG. 3 illustrates simulations illustrating the metastability exposure advantages of the design of FIG. 2 as compared to the design of FIG. 1. Note that increasing the size of the regeneration devices adds some capacitance to the evaluation nodes which adds a small amount of delay to the sampling device. That delay is acceptable for some applications but in other embodiments, the size of the regeneration device may be reduced to reduce the capacitance. Simulations were done to evaluate metastability exposure. Data was skewed relative to a fixed clock arrival time (Data-Clk arrival time) and the Clk-Q resolution time (the time between the rising edge of the clock and the resolution of the sampled signal) was measured. The y-axis is the Clk-Q resolution delay of the circuit when the data-Clk arrival time (x-axis) passes through the sampling point of embodiments shown in FIGS. 1 and 2. It is desirable to have a small data-clk arrival time window and a short clk-Q resolution time. That is, it is desirable to minimize the width of the sampling uncertainty window (the gap between curves 401 and 403 or 405 and 407) as well as the y-axis magnitude of the curves since a longer time to transition increases the uncertainty time of the outputs of the circuit. As shown in FIG. 3, the setup_clk_q for the circuit of FIG. 1 is shown as curve 401. The hold_clk_q for the circuit of FIG. 1 is shown as curve 403. The setup_clk_q for the circuit of FIG. 2 is shown as curve 405. The hold_clk_q for the circuit of FIG. 2 is shown as curve 407. As can be seen in the figure the curves 401 and 403 show a long resolution time resulting in greater metastability exposure while the curves 405 and 407 associated with embodiment of FIG. 2 with the secondary evaluation stage has shorter resolution times and a narrower metastability window.

Figure 4:
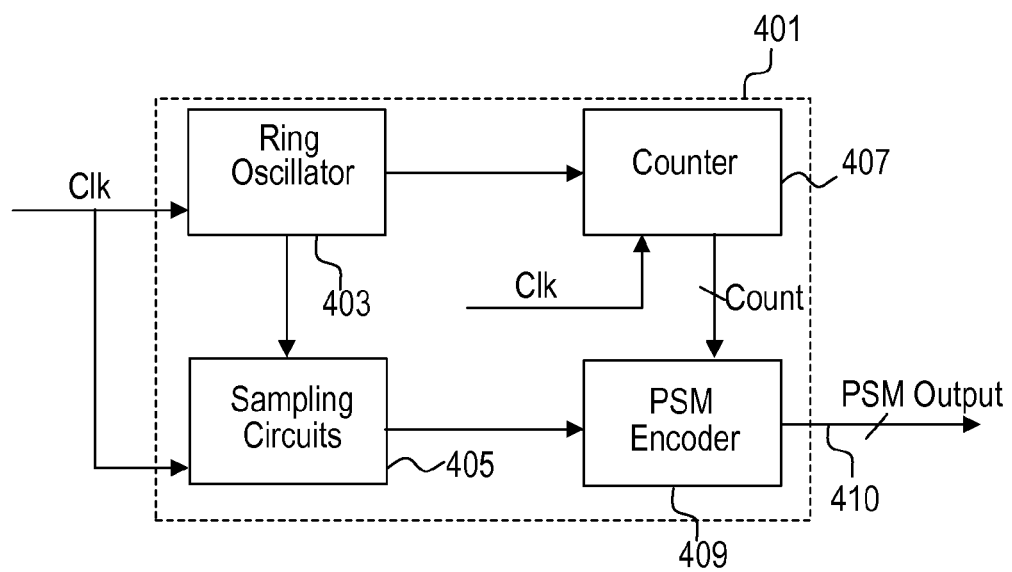
FIG. 4 shows an embodiment in which the sampling circuit shown in FIG. 2 is used as part of a power supply monitor circuit.
Figure 5:
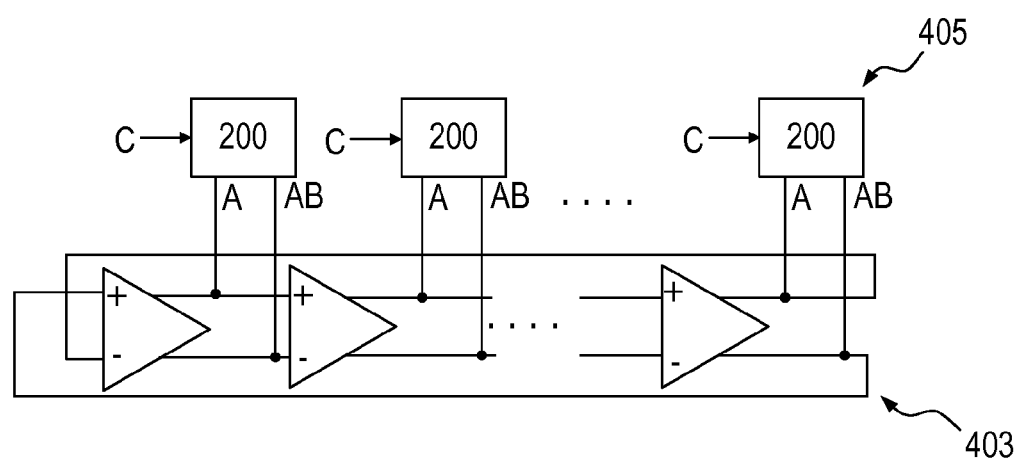
FIG. 5 shows additional details of the sampling circuit and ring oscillator of FIG. 4.

Referring to FIG. 4, illustrated is an exemplary power supply monitor (PSM) 401 that includes a ring oscillator 403 that can advantageously use embodiments of the sampling circuit described herein. Additional details on such a monitor can be found in U.S. Pat. No. 8,593,171, filed Nov. 19, 2010, entitled "Power Supply Monitor", which patent is incorporated herein by reference. The monitor 401 measures the number of stage transitions in the ring oscillator 403 during each measurement period, e.g., a clock cycle. Capture logic 405 captures the state of the ring oscillator stages at the end of the clock cycle. Capture logic 405 is formed by instances of sampling circuit 200. The counter logic 407 tracks the number of ring oscillator (RO) revolutions in one clock cycle. That data in turn is supplied to the encoder 409 that supplies a PSM output based on the state of the ring oscillator and the number of ring oscillator revolutions at the end of the cycle. FIG. 5 shows additional details of an embodiment of the oscillator and capture logic 405 with each stage of the oscillator 403 supplying inputs A and AB to a sampling circuit 200. While one application has been shown in FIGS. 4 and 5 that can advantageously use embodiments of the sampling circuit described herein, other asynchronous sampling applications can also advantageously use embodiments of the sampling circuit described herein.

While circuits and physical structures have been generally presumed in describing embodiments of the invention, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the embodiment set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A sampling circuit comprising:
    a first circuit to sample and hold input data responsive to a transition of a clock signal and to generate an output responsive to the data, wherein the output of the first circuit includes a set and a reset signal;
    the first circuit including,
        a first inverter having an input coupled to an inverted set signal node and the set signal;

a second inverter having an input coupled to an inverted reset signal node and supplying the reset signal;

third and fourth inverters cross coupled to hold a state corresponding to the input data sampled by the first circuit, the third inverter supplying the inverted set signal node and the fourth inverter supplying the inverted reset signal node; and a secondary evaluation circuit to help maintain the state of the first circuit after the transition of the clock signal;

the secondary evaluation circuit further including, a first evaluation transistor having a first current carrying node coupled to the inverted set signal node and a gate coupled to the set signal node;

a second evaluation transistor having a first current carrying node coupled to the inverted reset signal node and a gate coupled to the reset signal node; and a third evaluation transistor having a first current carrying node coupled to second current carrying nodes of the first and second evaluation transistors, the third evaluation transistor having a gate coupled to the clock signal and a second current carrying node coupled to ground.

2. The sampling circuit as recited in claim 1 wherein the first circuit further comprises a plurality of precharge transistors having gates coupled to the clock signal, at least one of the precharge transistors coupled between a power supply node and the inverted set signal node, another of the precharge transistors coupled between the power supply node and the inverted reset signal node, the precharge transistors to charge the inverted set and inverted reset nodes prior to the transition.

3. The sampling circuit as recited in claim 1 wherein the first, second, and third evaluation transistors of the secondary evaluation circuit are N-channel field effect transistors.

4. The sampling circuit as recited in claim 1, further comprising:

a set-reset (SR) latch coupled to the set and reset signals to supply an output corresponding to the input data.

5. The sampling circuit as recited in claim 1 wherein the first circuit samples the input data on a positive transition of the clock signal.

6. The sampling circuit, as recited in claim 1 wherein the input data is a differential input signal and wherein the first circuit further comprises:

a first transistor having a gate coupled to a positive input signal of the differential input signal and having a first current carrying terminal coupled to the first inverter;

a second transistor having a gate coupled to a complementary input signal of the differential input signal and having a first current carrying terminal coupled to the second inverter; and a third transistor having a gate coupled to the clock signal, the third transistor having current carrying terminals coupled between the second current carrying terminals of the first and second transistors and ground.

7. An apparatus comprising:

a ring oscillator;

a plurality of sampling circuits coupled to sample respective stages of the ring oscillator, each of the sampling circuits including, a first circuit to sample data responsive to a transition of a clock signal and to generate a set signal and a reset signal and hold a state corresponding to the set signal and the reset signal, the first circuit including, a first inverter having an input coupled to an inverted set signal node and supplying the set signal;

a second inverter having an input coupled to an inverted reset signal node and supplying the reset signal;

third and fourth inverters cross coupled to hold the state of the first circuit, the third inverter supplying the inverted set signal node and the fourth inverter supplying the inverted reset signal node; and a secondary evaluation circuit to help maintain the state of the first circuit after the transition of the clock signal, each secondary evaluation circuit including, a first evaluation transistor having a first current carrying node coupled to the inverted set signal node and a gate coupled to the set signal node;

a second evaluation transistor having a first current carrying node coupled to the inverted reset signal node and a gate coupled to the reset signal node; and a third evaluation transistor having a first current carrying node coupled to the second current carrying nodes of the first and second evaluation transistors, the third evaluation transistor having a gate coupled to the clock signal and a second current carrying node coupled to ground.

8. The apparatus as recited in claim 7 wherein the first, second, and third evaluation transistors are N-channel field effect transistors (NFETs).

9. A method comprising:

sampling input data responsive to a transition of a clock signal in a first circuit and generating a set signal and a reset signal responsive to a value of the input data;

supplying the set signal from a first inverter having an input coupled to an inverted set signal node;

supplying the reset signal from a second inverter having an input coupled to an inverted reset signal node; and supplying the inverted set signal and the inverted reset signal, respectively, from third and fourth cross coupled inverters that hold a state of the first circuit;

helping maintain the state of the first circuit using regenerative feedback devices to regenerate the state of the first circuit after the transition of the clock signal, wherein helping maintain the state includes, turning on a first evaluation transistor to provide a first path to ground after the transition of the clock signal;

supplying a second path to ground from the inverted set signal node after the transition of the clock signal through a second evaluation transistor and the first evaluation transistor responsive to the set signal being asserted to regenerate a low value of the inverted set signal node;

supplying a third path to ground from the inverted reset signal node after the transition of the clock signal through a third evaluation transistor and the first evaluation transistor responsive to the reset signal being asserted to regenerate a low value of the inverted reset signal node.

10. The method as recited in claim 9 precharging the inverted set node and the inverted reset nodes prior to the transition of the clock signal.

11. The method as recited in claim 9, further comprising:

supplying the set signal and the reset signal to an RS latch and supplying output data corresponding to the input data from the RS latch.

12. The method as recited in 9 wherein the transition of the clock signal is positive.

13. The method as recited in 9 wherein the input data is differential.

14. The method as recited in claim 9 further comprising supplying the input data from a ring oscillator.

* * * * *